United States Patent [19]

Schmid et al.

[11] Patent Number: 5,623,136

[45] Date of Patent: Apr. 22, 1997

[54] ASSEMBLY-OPTIMIZED ARRANGEMENT OF THE FUNCTIONAL ELEMENTS OF A TAXIMETER

[75] Inventors: Mechtilde Schmid, Villingen-Schwenningen; Holger Jäckle, Mönchweiler, both of Germany

[73] Assignee: Mannesmann Kienzle GmbH, Villingen-Schwenningen, Germany

[21] Appl. No.: 417,168

[22] Filed: Apr. 5, 1995

[30] Foreign Application Priority Data

Apr. 16, 1994 [DE] Germany .................. 9406371 U

[51] Int. Cl.⁶ .................................................. G07B 13/00
[52] U.S. Cl. ........................................................ 235/30 R
[58] Field of Search ............................ 235/29 A, 30 R, 235/45

[56] References Cited

U.S. PATENT DOCUMENTS 4,167,040  9/1979  Heritier et al. ............... 235/30 R X
4,789,774  12/1988  Koch et al. ....................... 235/30 R Primary Examiner—Cassandra C. Spyrou
Attorney, Agent, or Firm—Anderson Kill & Olick P.C.

[57] ABSTRACT

An assembly-optimized arrangement of the functional elements of a taximeter is disclosed which comprises a two-part housing which further comprises a front housing component and a rear housing component. The arrangement further comprises a printed circuit board carrying the electronic computer and the data and memory of the taximeter, a liquid crystal display, one of an optical fiber and an optical light guide allocated to the rear side of said liquid crystal display, a glass pane, control keys, a receiving means and an aligning means. The receiving means and the aligning means are designed at the front housing component which enable, during assembly of the taximeter, a loose retention of at least one of the glass pane, the liquid crystal display and the optical fiber at the front of the housing component by one of insertion and mounting. An attachment of functional elements occurs indirectly by fastening the printed circuit board to the front housing component.

5 Claims, 3 Drawing Sheets

ASSEMBLY-OPTIMIZED ARRANGEMENT OF THE FUNCTIONAL ELEMENTS OF A TAXIMETER

FIELD OF THE INVENTION

The invention pertains to an assembly-optimized arrangement of the functional elements of a taximeter which has an essentially two-part housing, a printed circuit board carrying the electronic computer and the data memory of the taximeter, a liquid crystal display, an optical fiber allocated to the rear side of-the liquid crystal display, a glass pane as well as control keys.

BACKGROUND OF THE INVENTION

Taximeters are used in vehicles for hire and serve, as is known, for the computation of the fare and its display so that the fare is easily legible for the driver and the customer. In computing the fare, values of a local rate scale are multiplied by distances and time units and are summed up. Since taximeters, in many cases, have to be installed in niches and recesses provided by the manufacturer in the dashboard of the vehicle involved, the dimensions of the apparatus are predetermined in such a way that an efficient utilization of the space available for the apparatus is necessary for a display which makes extensive use of the available format relative to the available front face of the appliance.

Apart from the fact that the purchaser of a taximeter expects that the taximeter is matched to the price range for vehicle instruments prevailing in the area of motor vehicles, the conditions of mass production must also be considered in the manufacture of taximeters:. This means that the lowest possible number of components, with the components being as simple as possible, as well an easy and largely mechanizable assembly, with a relatively low quantity of assembly steps, is to be sought.

SUMMARY OF THE INVENTION

The present invention is based upon the task of creating a taximeter whose architecture is optimally suitable for mass production so that the taximeter can be manufactured with a minimum of fabrication expense.

A solution to the defined task can be found in providing an assembly-optimized arrangement of the functional elements of a taximeter which has an essentially two-part housing, a printed circuit board carrying the electronic computer and the data and memory of the taximeter, a liquid crystal display, an optical fiber or optical light guide allocated to the rear side of the liquid crystal display, a glass pane as well as control keys. A receiving means and an aligning means are designed at the front housing component which enable, during assembly of the taximeter, a loose retention of at least the glass pane, the liquid crystal display and the optical fiber at the front and the housing component by insertion or mounting. The attachment of the functional elements occurs indirectly by fastening the printed circuit board to the front housing component.

The manufacturing advantage of the present invention can be seen, in particular, in the circumstance that a particularly simple assembly is possible. Herein, the printed circuit board is still accessible in a largely finish-assembled state of the apparatus, and thus, the apparatus can be tested, meaning only the rear housing component must be attached to the operationally ready component of the taximeter formed by the front housing component. The formation of the functionally ready constructional unit, and thus, the largely finished fabrication of the apparatus is achieved by an insertion and a plug-in of the functional elements in a single direction and, in the last analysis, by latching or detending the printed circuit board to the front housing component, preferably together using two screws.

The following assembly steps are performed in detail for creating the above-mentioned constructional unit. The front housing component, in other words, the front housing frame, is displayed. The glass pane equipped with holding or locating straps is inserted into the cutout of the front housing component. The liquid crystal display is placed directly upon the glass pane wherein alignment or orientation means are provided in the front housing component which define the position of the liquid crystal display. The optical fiber is slipped onto shoulders formed on the threaded bolt fashioned at the front housing component. The control keys are configured preferably at a plug-mat or switching-mat and passing through the front housing component as well as the connectors providing the electronic contact between the printed circuit board and the liquid crystal display are inserted. The printed circuit board is placed upon additional shoulder bolts configured at the front housing component and provided with through passages. The printed circuit board which rests upon the front ends of the threaded bolts is screwed down upon the bolts.

Accordingly, it is an object of the present invention to provide an assembly-optimized arrangement of the functional elements of a taximeter, and a method of assembly therefor, which provides an architecture which is optimally suitable for mass production so that the taximeter can be manufactured with a minimum of fabrication expense.

Other objects and advantages of the present invention will be evident to those skilled in the art upon a review of the Description of the Preferred Embodiment taken in conjunction with the Drawings which follow.

DESCRIPTION OF THE PREFERRED EMBODIMENT

Figure 1:
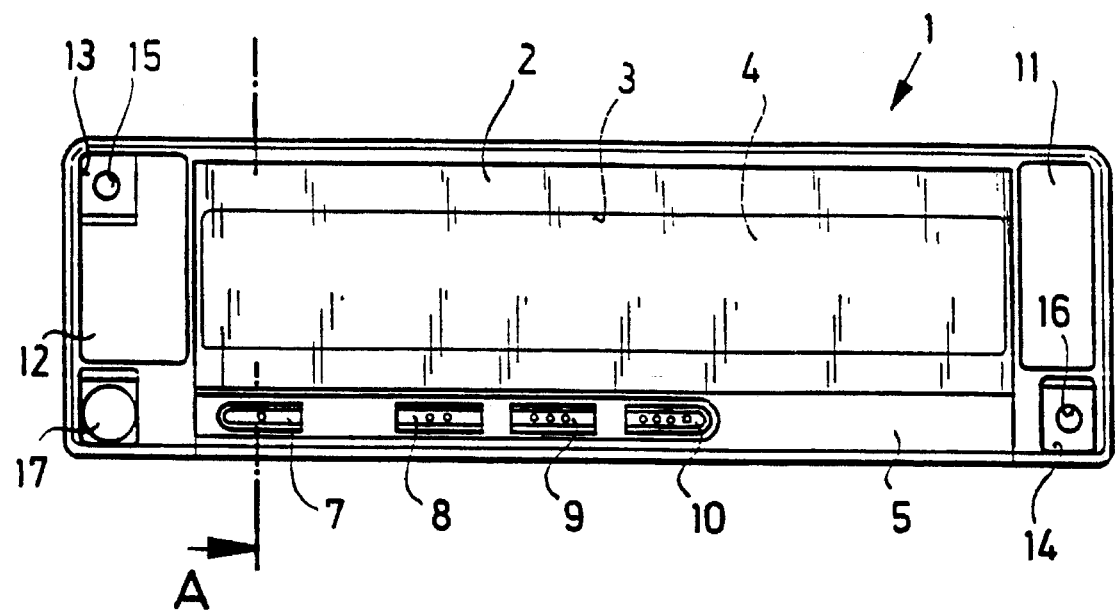
FIG. 1 is a front view of the taximeter of the present invention.

FIG. 1 shows the customary front side of a taximeter 1 with a glass pane 2, which serves as a script plate and on which a transparent region 3, for observation of the display means of the taximeter, preferably a liquid crystal display 4, is blanked out. The taximeter 1, whose housing consists of a frame- shaped front housing component 5 and a shell-shaped rear housing component 6 further comprises the customary control keys designated by reference numerals 7, 8, 9 and 10 and is provided with a nameplate 11.

The reference numeral 12 designates a cover, for a so-called service compartment, where a plug-in socket for a paramaterizer-plug and diagnostic-plug, as well as a buffer battery, are accessible. The reference numerals 13 and 14 designate recesses into which lead sealing cups allocated to the attachment so screws can be inserted upon assembly of the taximeter at the installation site. Bores, which serve for passage of the attachment screws, are designated by reference numerals 15 and 16. A screw connecting the housing components 5 and 6 is safetied by a lead seal 17.

Figure 2:
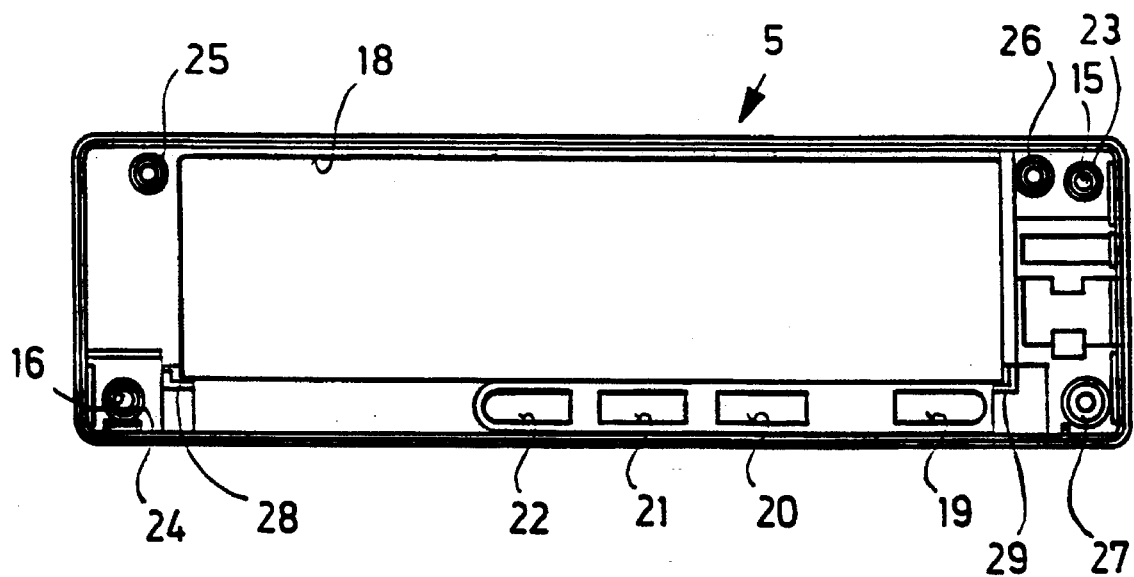
FIG. 2 is a rear view of the front housing component.

As can be seen from the rear view of the housing component 5 in FIG. 2, a relatively large cut-out 18 is provided for insertion of the glass pane 2. The apertures allocated to the control keys 7, 8, 9 and 10 are designated by the reference numerals 19, 20, 21 and 22. The bores, designated by reference numerals 15 and 16 in FIG. 1, are located in shoulder bolts 23 and 24. Further, two threaded bolts 25 and 26 are configured at the front housing component 5 which bolts are also provided with shoulders.

A post is designated by reference numeral 27, which serves as a spacing post in the course of the screw down of the front housing component 5 on the rear housing component 6. The screw (not shown) passing, for this purpose, through the post 27 is, as noted above, safetied by a lead seal 17. Two fashioned- thereon elbow pieces 28 and 29 serve, in addition, as alignment means, and in particular, for the liquid crystal display 4.

Figure 3:
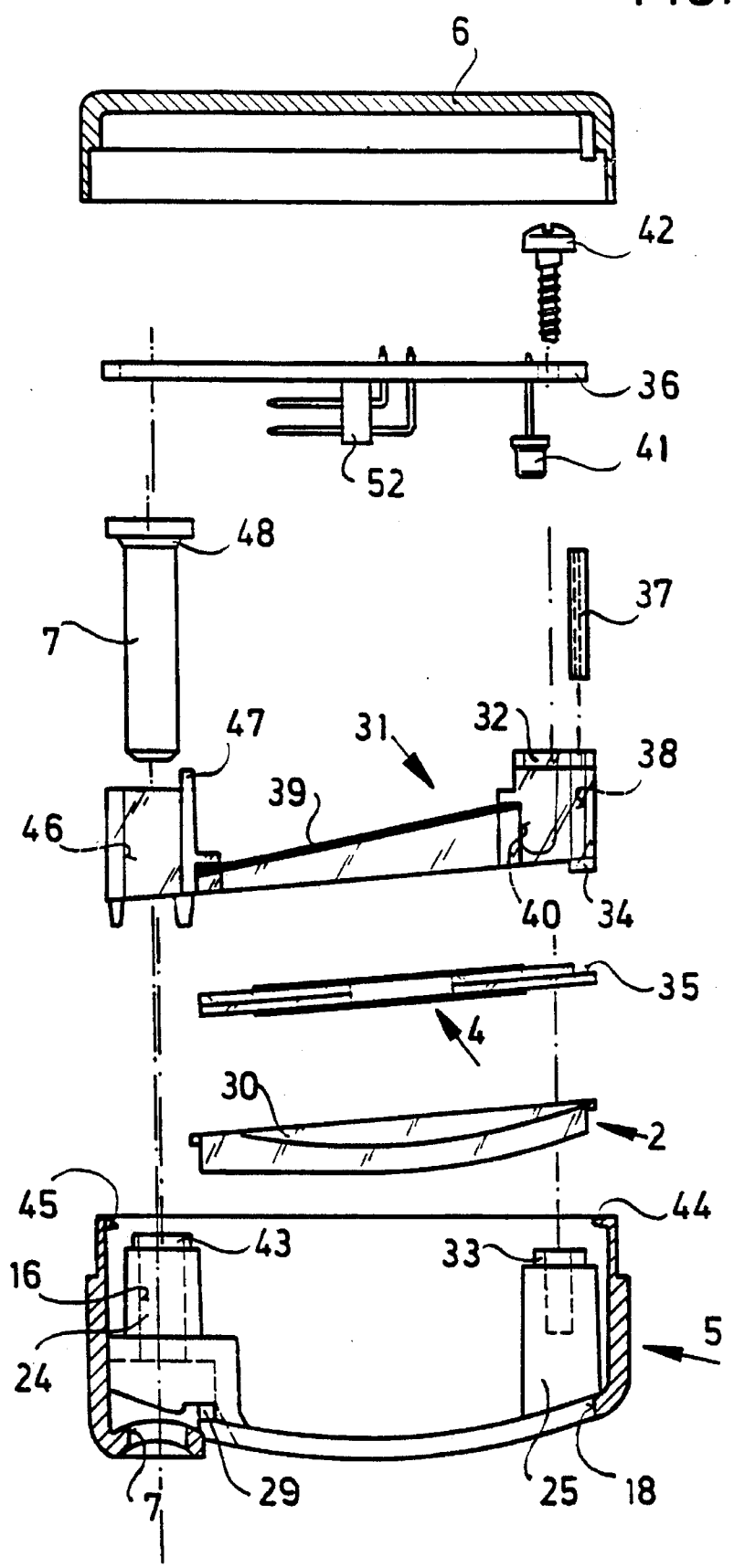
FIG. 3 is an exploded presentation of the housing components and the functional elements of the taximeter.

It can be seen from the exploded presentation in FIG. 3 that the front housing component 5 is the load carrying structural part of the taximeter 1 at which the remaining functional elements are aligned and loosely retained during assembly and are finally fastened to same. Herein, the assembly of a functionally finished structural unit, which has to be completed merely by attachment of the rear housing component 6, proceeds exclusively in one single direction. Contrary to the present embodiment example, wherein the connection of the housing components 5 and 6 is achieved by means of a screw located at the front side, this joining together is also feasible starting from the rear side.

During assembly, the glass pane 2, at which holding or locating straps are configured at least in part and actually following the contours of the housing component 5 is, to begin with, placed into the recess 18. The elbow pieces 28 and 29 serve, as noted above, as a mounting for the liquid crystal display 4 which is to be placed subsequently directly upon the glass pane 2. In addition, the liquid crystal display 4 is retained by an optical fiber 31. Eyelets are fastened at the optical fiber 31 whose width correspond to the height of the shoulders 33 configured on the threaded bolts 25 and 26. At least two fingers, configured at the optical fiber 31, are designated by the reference numeral 34, which partially engage into the one side of the liquid crystal display 4 designed to be stepped.

Contacts for activation of the individual character elements of the liquid crystal display 4 are placed on the step-like configured one end face of the liquid crystal display 4 and are designated by the reference numeral 35. The electrical connection of these contacts with contacts located upon a printed circuit board is achieved by means of one or several strip-shaped connectors 37 manufactured from elastic material, for whose retention suitable slots 38 are placed in the optical fiber 31.

A reflector retained in slots (not explicitly shown) is connected with the optical fiber 31 and is designated by the reference numeral 39. Further, a row of dead end bore bolts 40, having preferably bore bases configured in a spherical manner, is placed in the optical fiber 31. Light emitting diodes 41, fastened to the printed circuit board, dip into these dead end bores 40 when the printed circuit board 36 is connected to the housing component 5, in other words, when the printed circuit board 36 resting upon the end faces of the threaded bolts 25, 26 is screwed down on the front housing component 5 preferably by self-tapping screws of which one is shown and designated by the reference numeral 42 in FIGS. 3 and 4. The alignment of the printed circuit board 36 is obtained by mounting same upon the prolongations configured on the shoulder bolts 23 and 24 of which one such prolongation is designated by the reference numeral 43 in FIG. 3. The detent catches 44 and 45, provided at the housing component 5, serve for fixation of the printed circuit board 36 prior to the screw-down operation.

The control keys 7, 8, 9 and 10 must be installed prior to mounting and screwing down the printed circuit board 36. The control keys are inserted into apertures 46 worked into the optical light guide or optical fiber 31 to correspond to the cross-sectional shape of the key shafts. In other words, the apertures 46 correspond cross-section-wise to the apertures 19, 20, 21 and 22 and serve as guides for the key shafts. Preferably, the control keys are designed as a circuit-mat or switching-mat or as a switching-mat strip, which is held down upon the printed circuit board 36 by means of suitable webs 47 configured on the optical fiber 31, when the printed circuit board 36 is screwed down upon the housing component 5. In such a switching-mat, the detent or catch effect, meaning, the return of a control key after it has been actuated, occurs by means of a diaphragm-like elastic collar designated by the reference numeral 48.

Figure 4:
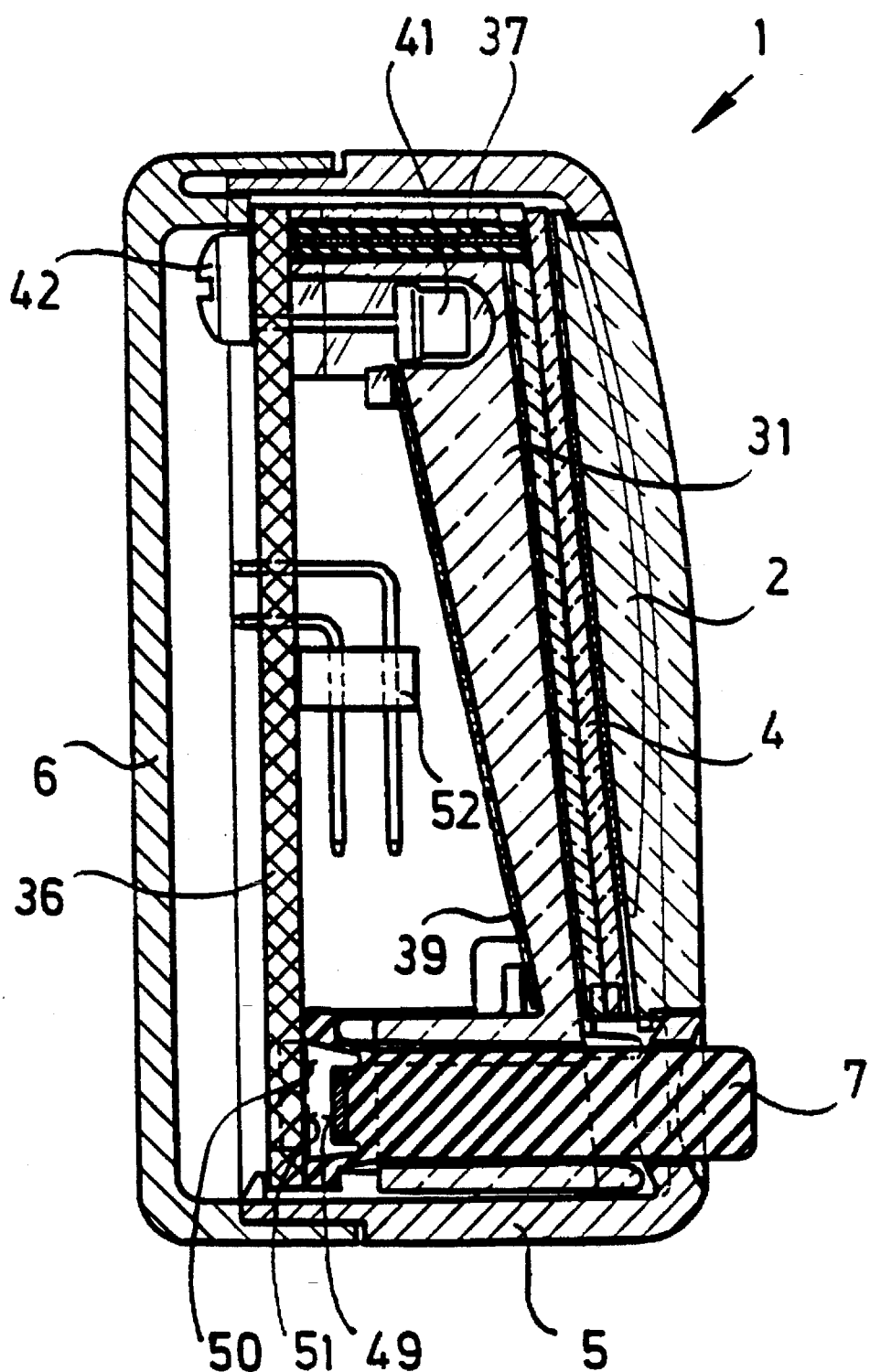
FIG. 4 is a section view through the line A in FIG. 1.

As is evident from FIG. 4, the control keys 7, 8, 9 and 10 are respectively provided with an electrically conductive disk 49, by means of which contacts 50, 51 disposed on the printed circuit board 36 are closed when a control key is actuated. In place of a plurality of electronic components disposed on the printed circuit board 36, a plug-in socket is shown and designated by the reference numeral 52 in FIGS. 3 and 4. For the remainder, FIG. 4 clarifies that the electronic components having different heights can be housed within the relatively shallow spaces on both sides of the printed circuit board 36 only if the spaces there available are used to the fullest extent, this with an apparatus depth of less than 30 millimeters achieved by the novel construction.

For reasons of completeness, it should additionally be noted that a pre-assembled structural unit can be formed consisting of the printed circuit board, the optical fiber and the in-between located switching-mat by configuring-means or snap-in means at the optical fiber 31 which embrace the printed circuit board 36 or engage into same. It is further conceivable that the glass pane 2 be shaped directly at the optical fiber 31 and that a slot be provided, into which the liquid crystal display 4, together with a printout plate, can be slid.

While the present invention has been described and illustrated in several preferred embodiment examples, such are merely illustrative of the present invention and are not to be construed to be limitations thereof. In this regard, the present invention encompasses any and all modifications, variations and/or alternate embodiments with the scope of the present invention limited only by the claims which follow.

What is claimed is:

1. A taximeter, comprising:
    a housing formed of a frame-shaped front housing component having a front wall with a cut-out, and a rear housing component secured with the front housing component;
    a glass plane received, at least partially, in the cut-out formed in the front wall of the front housing component;
    display means received in the front housing component and supported directly on the glass pane;

optical fiber means located in the front housing component on a side of the display means remote from the glass pane and abutting the remote side of the display means;

a plurality of control keys located in the front housing component and extending through respective openings formed in the front wall of the front housing component;

a control data-carrying printed circuit board located in the front housing component on a side of the optic fiber means remote from the display means;

aligning means located in the front housing component and defining a position of one of the display means, the optical fiber means, and the printed circuit board in the front housing component; and means for securing the printed circuit board to the front housing component, wherein the aligning means provides for a loose retention of at least of the glass pane, the display means, and the optical fiber means in the front housing component, and wherein the glass pane, the display means, the optical fiber means, and the control key are fixedly secured in the front housing component upon the printed circuit board being secured to the front housing component.

2. A taximeter according to claim 1, wherein said control keys are fashioned at a circuit-mat which, after the printed circuit board is attached to the front housing part, is clamped on the printed circuit board by contour means provided on one of functional elements of the taximeter.

3. A taximeter according to claim 1, further comprising connector means for connecting the display means with the printed circuit board, and wherein the optical fiber means has mounting means through which the connector means extends.

4. A taximeter according to claim 1, wherein the optical fiber means includes guide means through which the control keys extend.

5. A taximeter according to claim 1, wherein the front housing component includes threaded bolts with collars which serve as aligning means for the optical fiber means, and shoulder bolts with elongation which serve as aligning means for the printed circuit board, and wherein the printed circuit board is received on the elongations of the shoulder bolts, abuts the end surfaces of the threaded bolts, and is screwed down on same.

* * * * *